United States Patent
Mo et al.

[11] Patent Number: 5,956,279
[45] Date of Patent: Sep. 21, 1999

[54] STATIC RANDOM ACCESS MEMORY DEVICE WITH BURN-IN TEST CIRCUIT

[75] Inventors: Hyun-Sun Mo, Seoul; Choong-Keun Kwak, Kyunggi-do, both of Rep. of Korea

[73] Assignee: Samsune Electronics, Co., Ltd., Suwon, Rep. of Korea

[21] Appl. No.: 09/019,519

[22] Filed: Feb. 5, 1998

[30] Foreign Application Priority Data

Feb. 6, 1997 [KR] Rep. of Korea .......................... 97-3655

[51] Int. Cl.[6] ....................................................... G11C 7/00
[52] U.S. Cl. .................... 365/201; 365/185.09; 365/190; 365/203
[58] Field of Search ................................. 365/201, 154, 365/203, 185.09

[56] References Cited

U.S. PATENT DOCUMENTS

| | | | |
|---|---|---|---|
| 5,386,379 | 1/1995 | Ali-Yahia | 365/49 |
| 5,424,990 | 6/1995 | Ohsawa | 365/201 |
| 5,638,333 | 6/1997 | Lee | 365/205 |
| 5,732,032 | 3/1998 | Park et al. | 365/201 |
| 5,751,640 | 5/1998 | Gil | 365/156 |
| 5,754,467 | 5/1998 | Ikeda et al. | 365/154 |
| 5,764,564 | 6/1998 | Frake et al. | 365/154 |
| 5,770,957 | 6/1998 | Lee | 327/109 |
| 5,796,651 | 8/1998 | Horne et al. | 365/154 |
| 5,815,511 | 9/1998 | Yamamato | 371/22.5 |
| 5,877,976 | 3/1999 | Lattimore et al. | 365/190 |

*Primary Examiner*—David Nelms
*Assistant Examiner*—Gene N. Auduong
*Attorney, Agent, or Firm*—Marger Johnson & McCollom, P.C.

[57] ABSTRACT

A static random access memory (SRAM) device comprises an array of memory cells, a plurality of bit line precharge circuit for selectively delivering current to bit lines in response to a pair of control signals, during normal and burn-in test modes, and a burn-in current source circuit for selectively delivering current to the memory cells selected by the word lines along with the precharge circuit, in response to the control signals, during the burn-in test mode. In burn-in write operation, memory cells can be supplied with enough cell current without large increasing of chip size and power consumption in normal operation mode.

11 Claims, 4 Drawing Sheets

STATIC RANDOM ACCESS MEMORY DEVICE WITH BURN-IN TEST CIRCUIT

FIELD OF THE INVENTION

The present invention relates to a semiconductor memory device and, more particularly, to a burn-in circuit of a static random access memory device.

BACKGROUND OF THE INVENTION

For mature semiconductor products in high-volume manufacture, a considerable effort is made to determine and eliminate the predominant failure mechanisms identified in the initial reliability studies so that the normal life failure rate of device meets or exceeds the design goal. Possible wear-out mechanisms will have been identified and eliminated, either through modifications in the process or in the design. However, the manufactured devices will normally show the existence of continuing early life failures or infant mortality failures. Example of such defects includes oxide pinholes, photoresist or etching defects resulting in near-opens or shorts, contamination on the chip or in the package. A number of stress tests have thus been developed to accelerate the effects of various failure mechanisms.

A burn-in test, which is one of such stress tests, is typically performed before or after packaging (encapsulating) of a semiconductor device, in order to test the reliability of its internal circuits therein. The purpose of the burn-in test is to operate semiconductor memory devices for some period of time during which most of the devices that are subject to infant mortality failure actually fail. Failing the burn-in testing is preferable to having devices fail after they are installed in a system and delivered to the customer. The conditions during burn-in presumably accelerate the failure mechanisms that contributed to the infant mortality failures.

For many years, the demand for unencapsulated semiconductor dies (sometimes referred to as "Known Good Die"), which are typically manufactured in wafer form, has been rapidly increasing, because of assembly flexibility along with relatively low die prices. Burn-in tests of bare die (i.e., wafer burn-in test) have actually been carried out in the semiconductor industry and further advances for performing more effective wafer burn-in tests have been made.

During a wafer burn-in test for a semiconductor memory device such as a dynamic random access memory or a static random access memory, in order to detect defects or strength of memory cells stored in the same device, a plurality of word lines are selected at a time and an exterior voltage higher than the supply voltage is applied to each of the selected memory cells, thereby checking whether the memory cells are in good state or in bad state.

FIG. 1 is a schematic circuit diagram of a conventional static random access memory device. Referring to FIG. 1, the static random access memory (hereinafter, referred to as SRAM) includes an array 100 of memory cells located in a matrix of rows and columns, bit lines BLi and (where, i=1 to m), word lines WLj (where, j=1 to n), and bit line precharge circuits 200_1 to 200_m. A pair of bit lines and a word line correspond to each memory cell. Each of the bit line precharge circuits 200_i (i=1 to m) includes two transistors T1 and T2 and selectively delivers current to corresponding a bit line pair during normal and test modes in response to control signals PBL1 and PBL2.

FIG. 2 is a schematic circuit diagram of a typical six transistor CMOS SRAM cell with a corresponding bit line precharge circuit. The six transistor cell of FIG. 2 is capable of storing one binary bit of information. Referring to FIG. 2, the shown memory cell includes a bistable circuit composed of transistors T3, T4, T5, and T6. The memory cell further contains access transistors T7 and T8 serving as switches each of which being coupled between the bistable circuit and corresponding bit line BLi or $\overline{BLi}$.

In a wafer burn-in test mode, as well known, an appropriate number of word lines are selected at a time and all the memory cells coupled to the selected word lines are stressed by repeatedly performing write and read operations on those word lines. When the memory cell is addressed, that is, when an enable signal is placed on the word line WLj, transistors T7 and T8 become conductive. Therefore, bit line BLi becomes 788787 coupled to the drains of transistors T3 and T5 and the gates of transistors T4 and T6, and bit line $\overline{BLi}$ becomes coupled to the gates of transistors T3 and T5 and the drains of transistors T4 and T6. In the case of a data write operation, data writing of the cell is performed by means of the bit line precharge circuit 200_i, and bit lines BLi and $\overline{BLi}$ are placed in complementary states by the bit line precharge circuit 200_i. Therefore, in this mode, one bit data is stored as voltage levels with the two sides (i.e., nodes A and B) of the bistable circuit (T3, T4, T5, and T6) in opposite voltage configurations.

For convenience of explanation, assume that control signal PBL1 is activated and control signal PBL2 is inactivated when data of logic '1' state is written into the memory cell, and the control signal PBL1 is inactivated and the control signal PBL2 is activated when data of logic '0' state is written. In a write operation of logic '1' data, transistors T1, T7, and T8 are rendered conductive, while transistor T2 is rendered non-conductive. Bit line BLi and node A, thus, go high so that transistor T4 becomes conductive but transistor T6 becomes non-conductive. As a result, node B goes low. In response to the voltage level of node B, transistor T5 becomes conductive but transistor T3 becomes non-conductive. Thus, node A goes high. To the contrary, in the case of logic '0' data write operation, transistors T2, T7, and T8 become conductive, while transistor T1 becomes non-conductive. Bit line $\overline{BLi}$ and node B then go high, so that transistor T5 becomes non-conductive but transistor T3 becomes conductive. As a result, node A goes low. In response to the voltage level of node A, transistor T3 is turned off but transistor T5 is turned on, so that node B goes high.

Generally, each transistor within bit line precharge circuits should be designed to have an appropriate current driving ability, that is, only enough to supply current necessary for normal operation mode in which one word line is selected, considering chip size, power consumption in normal operation, etc. However, during a write/read operation of wafer burn-in test mode, since a plurality of word lines are simultaneously selected unlike during normal operation mode, there may be a shortage of cell current to the individual cells coupled to the selected word lines. This is due to the limitation of current driving ability of transistors within bit line precharge circuits. The cell current shortage will result in burn-in test instability and test failure at worst.

Moreover, this cell current shortage also makes it difficult to change the data states of the latched storage cells. For instance, in case that nodes A and B of FIG. 2 are retained low and high, respectively (i.e., logic '0' data is stored in the cell), when a logic '1' data write operation begins, transistors T1 and T7 are driven conductive and thus cell current flows from transistor T1 through transistors T7 to node A. However, since transistor T3 still remains conductive during early burn-in write operation, the cell current sinks into ground line 2. This cell current sink may be more serious in a six transistor full CMOS type cell than in other types. Therefore, in order to supply enough cell current in write operation of burn-in test mode, it will be required to increase the size of bit line precharge transistors, resulting in increasing of chip size and power consumption in normal operation mode.

SUMMARY OF THE INVENTION

It is therefore an object of the present invention to provide a static random access memory (SRAM) device capable of driving cell current well enough to carry out the burn-in write operation of the selected memory cells without increasing chip size and its normal operation power consumption.

According to an aspect of the present invention, there is provided a static random access memory (SRAM) device having a reduced burn-in time. The SRAM includes an array of memory cells, a plurality of bit line precharge circuit, and a burn-in current source circuit. Each memory cell has a bistable circuit coupled to a corresponding pair of bit lines and a corresponding word line and is capable of storing one binary bit of information having either of two stable data states. The bit line precharge circuits of this invention selectively deliver current to bit lines in response to a pair of control signals, both during a normal operation mode where only one of the word lines is selected and during a data write operation of a burn-in test mode where an appropriate number of word lines are simultaneously selected. The burn-in current source circuit selectively delivers current to the memory cells selected by the word lines along with the bit line precharge circuits, in response to the control signals, during the data write operation of the burn-in test mode. The control signals have the same phase in the normal mode and are mutually complementary during the write operations of the normal and burn-in test modes.

BRIEF DESCRIPTION OF THE DRAWINGS

A more complete appreciation of the present invention, and many of its attendant advantages will become readily apparent as the same becomes better understood by reference to the following detailed description when considered in conjunction with the accompanying drawings in which like reference symbols indicate the same or similar components.

DESCRIPTION OF THE PREFERRED EMBODIMENT

Figure 1:
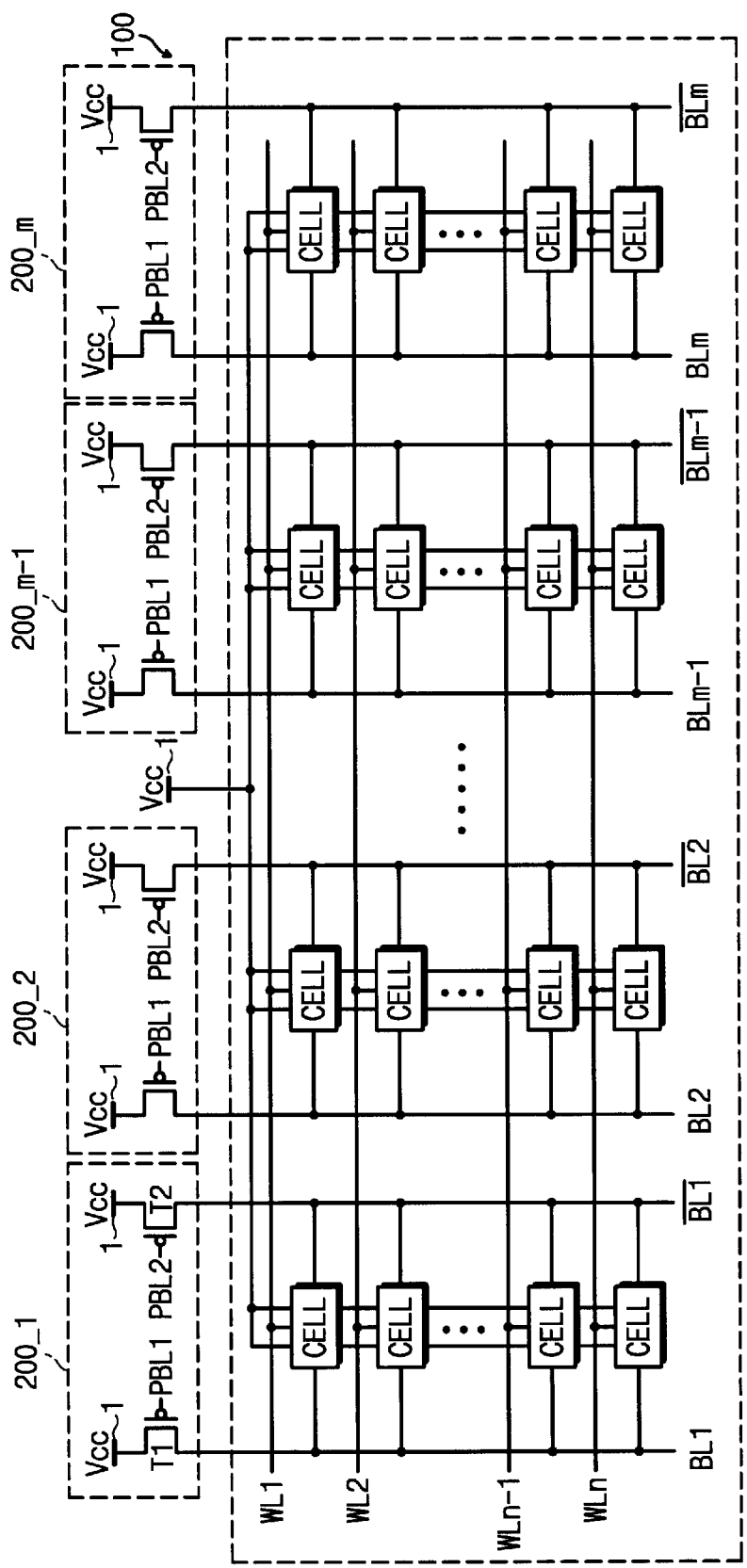
FIG. 1 is a schematic circuit diagram of a conventional SRAM device.
Figure 2:
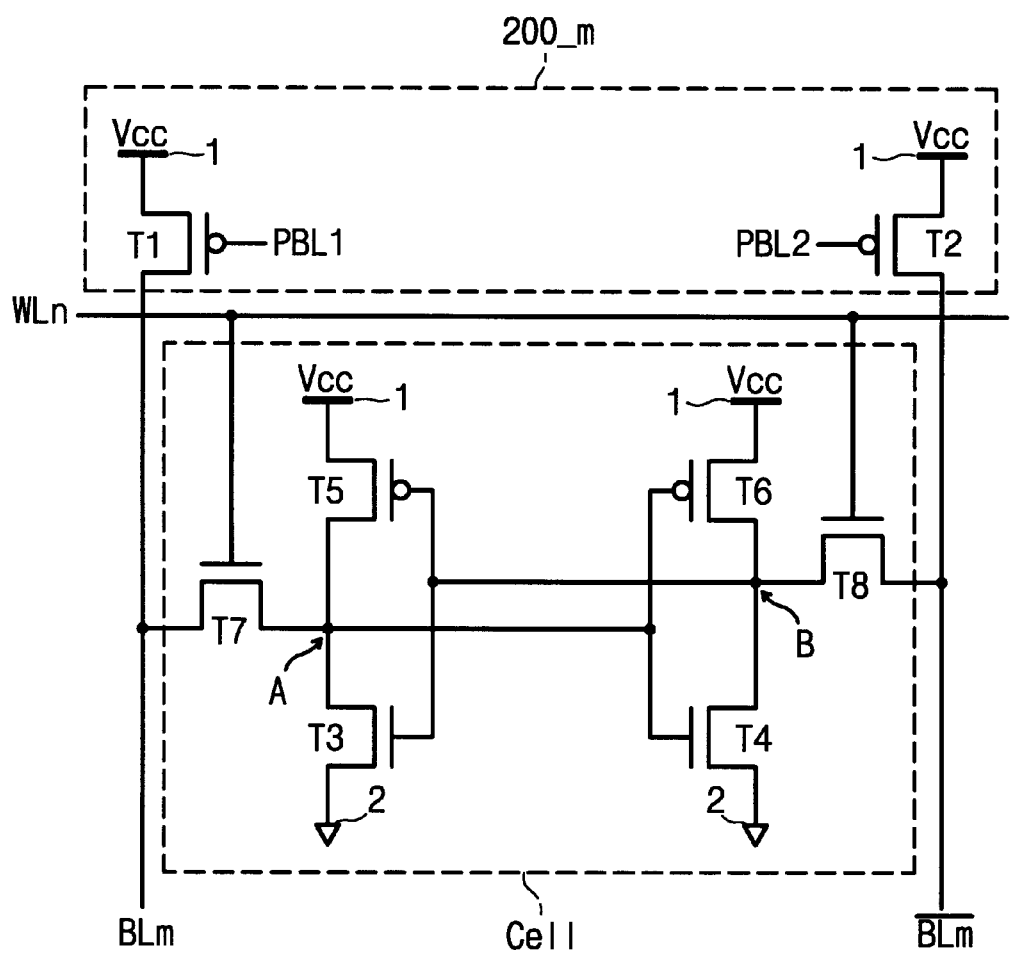
FIG. 2 is a schematic circuit diagram of an typical SRAM cell with a corresponding bit line precharge circuit.
Figure 3:
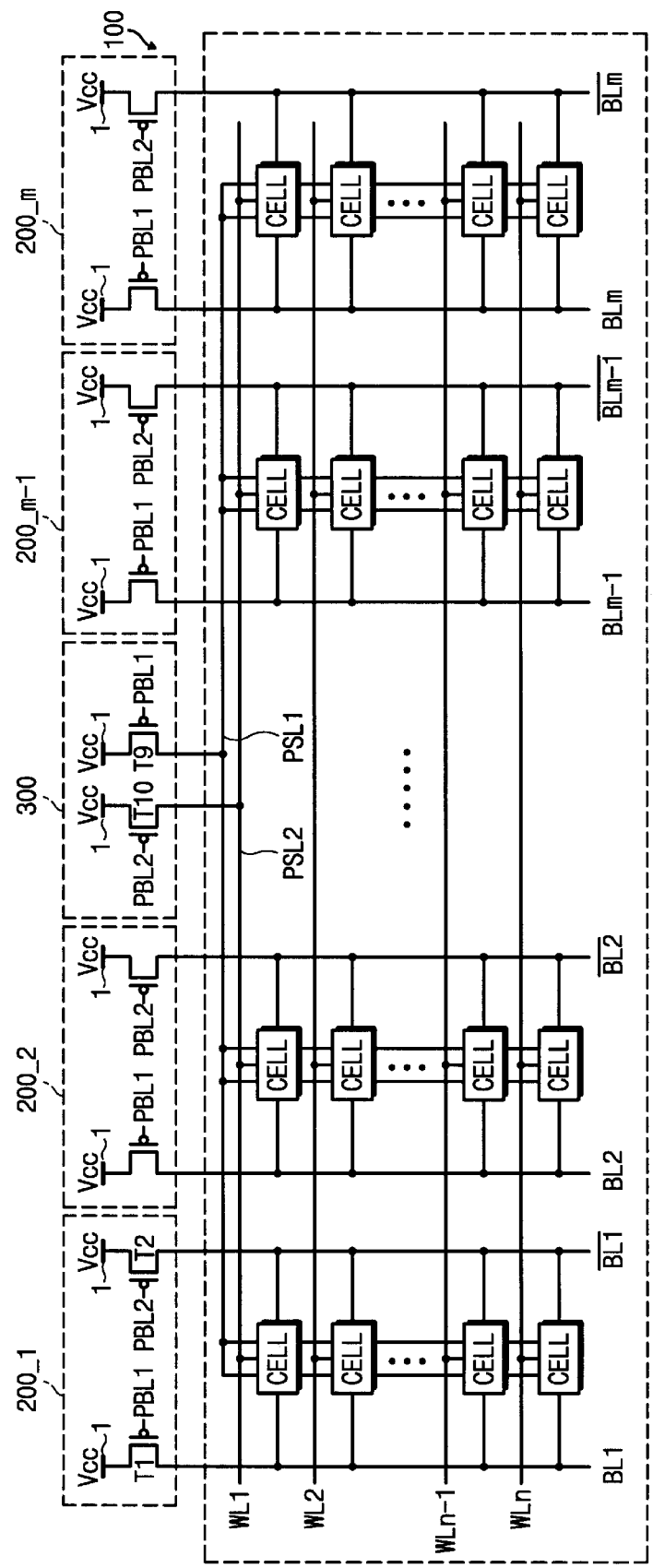
FIG. 3 is a schematic circuit diagram of an SRAM device according to an embodiment of the preset invention.

FIG. 3 is a schematic circuit diagram of a static random access memory (SRAM) device according to an embodiment of the present invention. Referring to FIG. 3, the SRAM includes an array 100 of memory cells located in a matrix of rows and columns so as to permit ease of addressing for read and write operations. Further included are bit lines BLi and $\overline{BL}0$ (where, i=1 to m), word lines WLj and $\overline{WL}0$ (where, j=1 to n), bit line precharge circuits 200_1 to 200_m for precharging the bit lines. For use generally in conjunction with the precharge circuits, this invention provides a burn-in current source circuit 300 for selectively delivering current to memory cells during burn-in test mode.

A pair of bit lines and a word line together correspond to each memory cell. Each bit line precharge circuit 200_1, 200_2, . . . , or 200_m includes two transistors T1 and T2 and selectively delivers current to a corresponding pair of bit lines in response to control signals PBL1 and PBL2 during normal and burn-in test modes. To improve read and write access speed in a normal operation mode, the precharge circuits with current source Vcc source additional current to the bit lines to overcome some of the time penalty introduced by distributed capacitance in the circuitry. As a result, a memory storage cell has rapid access times for both read and write and considerable stability when switching to either state.

The burn-in current source circuit 300, on the other hand, has two PMOS transistors T9 and T10 and selectively sources current in response to the control signals PBL1 and PBL2 during both normal and burn-in test modes, or only during the burn-in test mode. In normal mode, the control signals PBL1 and PBL have the same phase, but they are complementary in burn-in test mode.

Figure 4:
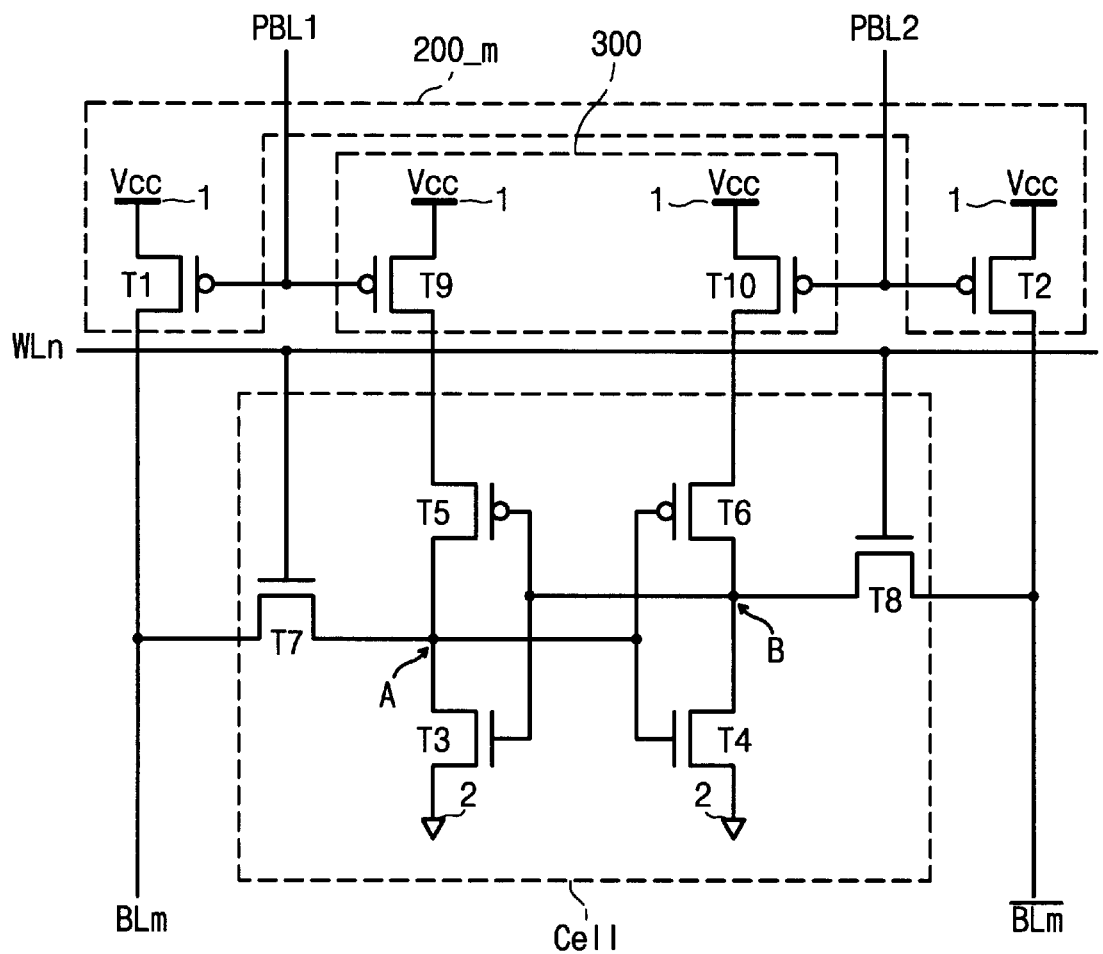
FIG. 4 is a schematic circuit diagram of an exemplary SRAM cell with corresponding bit line precharge circuit and burn-in current source circuit, according to an embodiment of this invention.

FIG. 4 is a schematic circuit diagram of a six transistor CMOS SRAM cell with corresponding bit line precharge circuit 200 and burn-in current source circuit 300, according to an embodiment of this invention. The six transistor cell of FIG. 4 is capable of storing one binary bit of information.

Still referring to FIG. 4, it can be seen that the memory cell includes a bistable circuit for latching one bit of information in opposite voltage configurations. The bistable circuit has a complementary metal oxide semiconductor (CMOS) circuit composed of NMOS storage transistors T3 and T4, and PMOS load transistors T5 and T6. The memory cell further contains NMOS access transistors T7 and T8 serving as switches, each of which being coupled between the bistable circuit (T3, T4, T5 and T6) and a corresponding bit line BLi or $\overline{BL}0$. The bit line pair BLi and $\overline{BL}0$ are coupled to PMOS transistors T1 and T2 within bit line precharge circuit 200_i, respectively. Transistors T5 and T6, often called pull-up transistors because of their coupling to the current source line 1, and that they operate in conjunction with precharge circuit 200_i to improve speed and stability. Also, transistors T1 and T2 offset leakage caused by storage and access transistors.

The junction node A (i.e., the drains) of transistors T3 and T5 and the gates of transistors T4 and T6 are coupled through access transistor T7 to bit line BLi. The junction node B (i.e., the drains) of transistors T4 and T6 and the gates of transistors T3 and T5 are coupled through access transistor T8 to bit line $\overline{BL}0$. The gates of access transistors T7 and T8 are commonly coupled to word line WLj. The current path of transistor T1 is coupled between current source line 1 and bit line BLi, while the current path of transistor T2 is coupled between current source line 1 and bit line $\overline{BL}0$.

As briefly described above, burn-in current source circuit 300 has two PMOS transistors T9 and T10. The current path of transistor T9 is coupled between current source line 1 and the junction node A of transistors T3 and T5, and the current paths of storage transistor T3 and load transistor T5 are coupled in series between current source line 1 and ground line 2. Similarly, the current path of transistor T10 is coupled between current source line 1 and the junction node B of transistors T4 and T6, and the current paths of storage transistor T4 and load transistor T6 are coupled in series between current source line 1 and ground line 2.

In above described SRAM cell, data is stored as voltage levels with the two sides of the bistable circuit (T3, T4, T5 and T6) in opposite voltage configurations, that is, the node A is high and the node B is low in one state, and the node A is low and the node B is high in the other state, resulting in two stable states.

In burn-in test mode, an appropriate number of word lines are selected at a time by use of buffer decoding technique, and all the memory cells coupled to the selected word lines are stressed by repeatedly performing write and read operations on them. The state of storage transistor pair T3 and T4 may be read or changed whenever transistors T7 and T8 are made conductive by word line WLj. When transistor T7 is conductive, bit line BLi is electrically coupled to the drains of transistors T3 and T5 and the gates of transistors T4 and T6. Similarly, bit line $\overline{BL0}$ is electrically coupled to the gates of transistors T3 and T5 and the drains of transistors T4 and T6 when transistor T8 goes conductive.

In a write operation for burn-in testing, when the cell is addressed (i.e., when an enable signal is placed on word line WLj), bit line pair BLi and $\overline{BL0}$ are placed in complementary states. At that time, since transistors T7 and T8 are rendered conductive by word line WLj, storage transistor pair T3 and T4 are driven to the complementary states defined by bit lines BLi and $\overline{BL0}$. For purposes of explanation, assume that control signal PBL1 is activated and control signal PBL2 is inactivated when data of logic '1' state is written into the memory cell, and the control signal PBL1 is inactivated and the control signal PBL2 is activated when data of logic '0' state is written.

In a write operation of logic '1' data, transistors T1, T7, T8, and T9 are driven conductive, while transistors T2 and T10 are rendered non-conductive. Bit line BLi and node A, thus, go high so that transistor T4 becomes conductive but transistor T6 becomes non-conductive. As a result, node B goes low. In response to the voltage level of node B, transistor T5 becomes conductive but transistor T3 becomes non-conductive. Thus, node A goes high.

On the contrary, in the case of logic '0' data write operation, transistors T2, T7, T8, and T10 become conductive, while transistors T1 and T9 become non-conductive. Bit line $\overline{BL0}$ and node B then go high, so that transistor T5 becomes non-conductive but transistor T3 becomes conductive. As a result, node A goes low. In response to the voltage level of node A, transistor T3 is turned off but transistor T5 is turned on, so that node B goes high.

Changing the data states in SRAM cells of this invention is easier than in conventional SRAM cells since either of two transistors in the burn-in current source circuit 300 is driven conductive along with bit line precharge transistors. That is, node A can go high enough by means of transistor T9 during burn-in write operation of logic '1' data, and node B can go high enough by means of transistor T10 during burn-in write operation of logic '0' data.

According to this invention, in a burn-in write operation, memory cells can be supplied with enough cell current without increasing of chip size and power consumption in normal operation mode, accordingly, preventing burn-in test failure due to the shortage of cell current.

While the invention has been described in terms of an exemplary embodiment, it is contemplated that it may be practiced as outlined above with modifications within the spirit and scope of the appended claims.

What is claimed is:

1. A memory device capable of processing control signals, comprising:
   a plurality of bit lines;
   a plurality of word lines;
   an array of memory cells being capable of storing at least one binary bit of information having either of two data states, said memory cells in communication with said bit lines and said word lines; and
   a burn-in current source circuit responsive to a first and a second control signals configured to selectively source current to said memory cells selected by an appropriate number of word lines during a burn-in test mode, the first and second control signals being complementary to each other in a burn-in test mode and in-phase in a normal mode.

2. A memory device as recited in claim 1, further comprising:
   a precharge circuit responsive to said first and second control signals configured to precharge said bit lines during the normal mode where only one of said word lines is selected and for selectively sourcing current to said bit lines during the burn-in test mode where said appropriate number of said word lines are selected along with said burn-in current source circuit.

3. A memory device as recited in claim 1, wherein said memory cells includes storage circuits including storage transistors.

4. A memory device as recited in claim 3, wherein said storage circuits are bistable circuits.

5. A memory device as recited in claim 3, wherein said burn-in current source circuit. comprises:
   a current source line;
   two MOS transistors having current paths coupled from said current source line to said storage transistors and are configured to be turned on/off in response to said control signals.

6. In a memory circuit including a plurality of bit lines, a plurality of word lines, an array of memory cells including storage circuits, each of which being coupled to a corresponding pair of said bit lines and to a corresponding one of said word lines, a method for burning in said memory circuit, comprising:
   generating a first and second control signals to initiate a burn-in test mode;
   selecting an appropriate number of word lines to test;
   activating a burn-in current source circuit responsive to the first and second control signals;
   selectively sourcing current to said memory cells selected by said appropriate number of said word lines;
   wherein the first and second control signals are complementary to each other in the burn-in test mode and in-phase with each other in a normal mode.

7. A method as recited in claim 6 further comprising:
   activating a precharge circuit responsive to the first and second signals;
   selectively sourcing current to said bit lines substantially simultaneously with said activating of a burn-in current source circuit step.

8. A static random access memory device, comprising:

a plurality of bit lines;

a plurality of word lines;

an array of memory cells, each having a bistable circuit coupled to a corresponding pair of said bit lines and to a corresponding one of said word lines and being capable of storing one binary bit of information having either of two stable data states;

first means responsive to a pair of control signals, said first means for precharging said bit lines during a normal operation mode where only one of said word lines is selected and for selectively sourcing current to said bit lines during a data write operation of a burn-in test mode where an appropriate number of word lines are simultaneously selected; and second means responsive to said control signals, said second means for selectively sourcing current to said memory cells selected by said appropriate number of said word lines, along with said first means, during the data write operation of the burn-in test mode;

wherein said control signals have same phase during the normal operation mode and are mutually complementary during the write operation of burn-in test mode.

9. The memory device according to claim 8, wherein said bistable circuit is formed by CMOS circuit.

10. The memory device according claim 8, wherein said bistable circuit comprises a pair of storage transistors for storing the data states in opposite voltage configurations respectively, a pair of access transistors for coupling said corresponding bit line pair to said storage transistors respectively when said corresponding word line is selected, and load elements for offsetting leakage caused by said storage and access transistors.

11. The memory device according to claim 10, wherein said second means comprises a current source line, and two MOS transistors having current paths coupled from said current source line to said storage transistors, respectively, and are configured to be turned on/off in response to said control signals, respectively.

* * * * *

UNITED STATES PATENT AND TRADEMARK OFFICE
CERTIFICATE OF CORRECTION

PATENT NO.    : 5,956,279
DATED         : September 21, 1999
INVENTOR(S)   : Hyun-Sun Mo et al.

It is certified that error appears in the above-identified patent and that said Letters Patent is hereby corrected as shown below:

Title page,
ABSTRACT, "without large increasing" should read -- without increasing --;

Column 1,
Line 58, "Bli and (where" should read -- Bli and $\overline{BLi}$ (where --;

Column 2,
Line 7, " $\overline{BLi}$ 0." should read -- $\overline{BLi}$ . --;

Line 18, " $\overline{BLi}$ 0." should read -- $\overline{BLi}$ . --;

Line 22, " $\overline{BLi}$ 0." should read -- $\overline{BLi}$ . --;

Line 43, " $\overline{BLi}$ 0." should read -- $\overline{BLi}$ . --;

Column 3,
Line 56, "preset invention" should read -- present invention --;

Column 4,
Line 5, " $\overline{BLi}$ 0" should read -- $\overline{BLi}$ --;

Line 6, " $\overline{BLi}$ 0" should read -- $\overline{WLj}$ --;

Line 45, " $\overline{BLi}$ 0" should read -- $\overline{BLi}$ --;

UNITED STATES PATENT AND TRADEMARK OFFICE
CERTIFICATE OF CORRECTION

PATENT NO. : 5,956,279
DATED : September 21, 1999
INVENTOR(S) : Hyun-Sun Mo et al.

It is certified that error appears in the above-identified patent and that said Letters Patent is hereby corrected as shown below:

<u>Column 4 cont'd,</u>
Line 58, " $\overline{BLi}$ 0" should read -- $\overline{BLi}$ --;

Line 64, " $\overline{BLi}$ 0" should read -- $\overline{BLi}$ --;

<u>Column 5,</u>
Line 24, " $\overline{BLi}$ 0" should read -- $\overline{BLi}$ --;

Line 30, " $\overline{BLi}$ 0" should read - $\overline{BLi}$ ---;

Line 34, " $\overline{BLi}$ 0" should read -- $\overline{BLi}$ --;

Line 52, " $\overline{BLi}$ 0" should read -- $\overline{BLi}$ --;

Signed and Sealed this

Twenty-seventh Day of May, 2003

JAMES E. ROGAN
*Director of the United States Patent and Trademark Office*